(12) United States Patent
Nagata et al.

(10) Patent No.: US 11,586,235 B2
(45) Date of Patent: Feb. 21, 2023

(54) LINEAR POWER SUPPLY CIRCUIT WITH PHASE COMPENSATION CIRCUIT

(71) Applicant: Rohm Co., Ltd., Kyoto (JP)

(72) Inventors: Takeshi Nagata, Kyoto (JP); Hironori Sumitomo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/363,231

(22) Filed: Jun. 30, 2021

(65) Prior Publication Data

US 2022/0011799 A1 Jan. 13, 2022

(30) Foreign Application Priority Data

Jul. 9, 2020 (JP) .............................. JP2020-118397

(51) Int. Cl.

| G05F 1/575 | (2006.01) |
|---|---|
| G05F 3/26 | (2006.01) |
| G05F 1/59 | (2006.01) |
| H03F 3/45 | (2006.01) |
| H03K 17/0814 | (2006.01) |
| B60R 16/03 | (2006.01) |

(52) U.S. Cl.
CPC .............. *G05F 1/575* (2013.01); *B60R 16/03* (2013.01); *G05F 3/262* (2013.01); *H03F 3/45179* (2013.01); *H03K 17/08142* (2013.01)

(58) Field of Classification Search
CPC . G05F 1/575; G05F 1/59; G05F 3/262; H03F 3/45179; H03K 17/08142
See application file for complete search history.

(56) References Cited

U.S. PATENT DOCUMENTS

| 4,910,472 A | * | 3/1990 | Tanino | ................... | H03K 3/354 |
| | | | | | 331/113 R |
| 6,430,064 B1 | * | 8/2002 | Tsuchimoto | ........... | H05B 45/34 |
| | | | | | 363/24 |

(Continued)

FOREIGN PATENT DOCUMENTS

| DE | 102021117102 A1 | * | 1/2022 | ............. | B60R 16/03 |
| JP | 2003084843 A | * | 3/2003 | ............. | G05F 1/575 |

(Continued)

OTHER PUBLICATIONS

DE Office Action in German Appln. No. 102021117102.4, dated Sep. 28, 2022, 9 pages (with English Translation).

*Primary Examiner* — Sisay G Tiku
(74) *Attorney, Agent, or Firm* — Fish & Richardson P.C.

(57) ABSTRACT

A linear power supply circuit includes: an output stage including a first output transistor and a second output transistor, which are provided between an input terminal to which an input voltage is able to be applied and an output terminal to which an output voltage is able to be applied and are connected in parallel to each other; a driver configured to drive the first output transistor and the second output transistor based on a difference between a voltage based on the output voltage and a reference voltage; a resistor inserted between a gate of the first output transistor and a gate of the second output transistor; a capacitor having one end connected to the input terminal and the other end connected to a connection node between the resistor and the gate of the second output transistor; and a clamp element connected in parallel to the resistor.

14 Claims, 12 Drawing Sheets

(56) References Cited

U.S. PATENT DOCUMENTS

| | | | | |
|---|---|---|---|---|
| 6,861,827 B1* | 3/2005 | Yang | | G05F 1/575 |
| | | | | 323/280 |
| 7,009,828 B2* | 3/2006 | Ito | | H03K 17/08144 |
| | | | | 361/91.8 |
| 10,429,867 B1* | 10/2019 | Kim | | G05F 1/575 |
| 2003/0107433 A1* | 6/2003 | Arai | | H03G 3/3047 |
| | | | | 330/285 |
| 2005/0184711 A1* | 8/2005 | Chen | | G05F 1/575 |
| | | | | 323/280 |
| 2006/0091934 A1* | 5/2006 | Pan | | H03K 19/00315 |
| | | | | 327/541 |
| 2007/0216381 A1* | 9/2007 | Tsuchiya | | G05F 1/575 |
| | | | | 323/273 |
| 2008/0284394 A1* | 11/2008 | Yin | | G05F 1/575 |
| | | | | 327/537 |
| 2008/0284395 A1* | 11/2008 | Wang | | G05F 1/56 |
| | | | | 323/282 |
| 2009/0128107 A1* | 5/2009 | Wang | | G05F 1/575 |
| | | | | 323/280 |
| 2010/0117609 A1* | 5/2010 | Koleno | | G05F 1/575 |
| | | | | 323/273 |
| 2012/0262227 A1* | 10/2012 | Nagata | | G05F 3/242 |
| | | | | 327/541 |
| 2013/0307502 A1* | 11/2013 | Bhattacharyya | | G05F 1/565 |
| | | | | 323/282 |
| 2013/0341192 A1* | 12/2013 | Dunbar | | H03F 3/45076 |
| | | | | 204/601 |
| 2014/0063668 A1* | 3/2014 | Nagata | | G05F 1/56 |
| | | | | 361/57 |
| 2015/0023398 A1 | 1/2015 | Ren et al. | | |
| 2015/0205314 A1* | 7/2015 | Hayashi | | G05F 1/56 |
| | | | | 323/217 |
| 2016/0299518 A1* | 10/2016 | Iwata | | G05F 1/468 |
| 2017/0115678 A1* | 4/2017 | Qing | | G05F 1/575 |
| 2017/0212542 A1* | 7/2017 | Bhattad | | G05F 1/575 |
| 2017/0302153 A1* | 10/2017 | Mochiki | | H02M 7/003 |
| 2020/0064875 A1* | 2/2020 | Gonapati | | G05F 1/573 |
| 2020/0125126 A1 | 4/2020 | Gupta et al. | | |
| 2020/0133323 A1* | 4/2020 | Takobe | | G05F 1/59 |
| 2020/0133324 A1* | 4/2020 | Nagata | | G05F 1/59 |
| 2020/0264644 A1* | 8/2020 | Inoue | | G05F 1/575 |
| 2021/0380053 A1* | 12/2021 | Takobe | | B60R 16/03 |
| 2022/0158535 A1* | 5/2022 | Takobe | | B60L 1/00 |
| 2022/0283600 A1* | 9/2022 | Matsuo | | G05F 1/575 |

FOREIGN PATENT DOCUMENTS

| | | | | |
|---|---|---|---|---|
| JP | 2020-071681 | | 5/2020 | |
| JP | 2020071710 A | * | 5/2020 | |
| WO | WO-2020090551 A1 | * | 5/2020 | B60R 16/03 |
| WO | WO-2020090616 A1 | * | 5/2020 | B60R 16/03 |
| WO | WO-2020209369 A1 | * | 10/2020 | B60L 1/00 |

* cited by examiner

LINEAR POWER SUPPLY CIRCUIT WITH PHASE COMPENSATION CIRCUIT

CROSS-REFERENCE TO RELATED APPLICATION

This application is based upon and claims the benefit of priority from Japanese Patent Application No. 2020-118397, filed on Jul. 9, 2020, the entire contents of which are incorporated herein by reference.

TECHNICAL FIELD

The present disclosure relates to a linear power supply circuit.

BACKGROUND

A linear power supply circuit such as an LDO (Low Drop Out) or the like is used as a power supply means for various devices.

It is desirable that the linear power supply circuit can perform phase compensation without significantly increasing the circuit area even when the capacitance value of an output capacitor is reduced.

FIG. 10 is a diagram showing a linear power supply circuit in the related art.

The linear power supply circuit in the related art includes an input terminal T1, an output terminal T2, a first output transistor 1, a driver 2, a reference voltage generator 3, and a phase compensation circuit 8. Further, an output capacitor 6 and a load 7 are externally attached so that an input voltage VIN is stepped down to generate an output voltage VOUT, which in turn is supplied to the load 7. Conductivity (i.e., an on-resistance value) of the first output transistor 1 and a second output transistor 81 described later is controlled by a gate signal G1. In the configuration shown in FIG. 10, PMOSFETs (P-channel type metal-oxide-semiconductor field effect transistors) are used as the first output transistor 1 and the second output transistor 81. Accordingly, as a voltage level of the gate signal G1 decreases, the conductivity of the first output transistor 1 and the second output transistor 81 increases, whereby the output voltage VOUT increases.

The driver 2 includes a differential amplifier 21, a capacitor 22, a PMOSFET 23, a current amplifier 24, and a PMOSFET 25 that constitutes a current mirror.

An output of the differential amplifier 21 is applied to one end of the capacitor 22, and the ground potential is applied to the other end of the capacitor 22. Therefore, a connection node between the differential amplifier 21 and the capacitor 22 is grounded in a high frequency band, which makes it possible to realize high-speed responsiveness of the driver 2.

The phase compensation circuit 8 includes the second output transistor 81, a resistor 82, and a capacitor 83.

One end of the resistor 82 is connected to each gate of the first output transistor 1 and the PMOSFET 25 constituting a current mirror, and the other end of the resistor 82 is connected to a gate of the second output transistor 81. The capacitor 83 is provided between a gate and a source of the second output transistor 81.

Here, the function of the phase compensation circuit 8 of the linear power supply circuit in the related art shown in FIG. 10 will be described. FIG. 11 is a diagram showing gain characteristics of a transfer function of the first output transistor 1 and the phase compensation circuit 8. A first pole frequency FP1' is a frequency of a first pole generated by a parasitic capacitance CPD. The first pole of the transfer function of the first output transistor 1 is a pole in which the output capacitor 6 is not involved.

As a current flows through the second output transistor 81 having a gate to which a CR circuit (resistor 82 and capacitor 83) is connected, the first pole frequency FP1' is shifted to a lower frequency band as compared with a case where the phase compensation circuit 8 is missing (indicated by a thick dotted line). As a result, the gain in a frequency band higher than the first pole frequency FP1' is lowered as compared with a case where the first pole frequency FP1' is not shifted to the lower frequency band.

Further, since the first output transistor 1 and the second output transistor 81 are connected in parallel and the first output transistor 1 is not affected by the resistor 82, a pole also exists at an original position before the first pole frequency FP1' is shifted to the lower frequency band, and a frequency of the pole becomes a second pole frequency FP2'. Since the first pole frequency FP1' is shifted to the lower frequency band and the gain is reduced, a zero cross frequency FZC' is shifted to a lower frequency band.

The first pole frequency FP1' and the second pole frequency FP2' are related to a second pole frequency of a transfer function of the output capacitor 6 and the linear power supply circuit shown in FIG. 10. Therefore, the phase compensation circuit 8 can shift the second pole frequency of the transfer function of the output capacitor 6 and the linear power supply circuit shown in FIG. 10 to a lower frequency band as compared with the case where the phase compensation circuit 8 is not provided. Due to the shift, in a frequency band higher than the second pole frequency of the transfer function of the output capacitor 6 and the linear power supply circuit shown in FIG. 10, the phase compensation circuit 8 can reduce a gain of the transfer function of the output capacitor 6 and the linear power supply circuit shown in FIG. 10 as compared with the case where the phase compensation circuit 8 is not provided. As a result, a zero cross frequency of the transfer function of the output capacitor 6 and the linear power supply circuit shown in FIG. 10 is shifted to a lower frequency band. That is, in the linear power supply circuit shown in FIG. 10, even when a capacitance of the output capacitor 6 is reduced, it is possible to perform phase compensation only by adding the phase compensation circuit 8 (without significantly increasing the circuit area).

FIG. 12 is a diagram showing a relationship between the input voltage VIN, the gate voltage of each of the first output transistor 1 and the second output transistor 81, and the output voltage VOUT in the linear power supply circuit shown in FIG. 10. The vertical axis in FIG. 12 indicates voltage and the horizontal axis indicates time. That is, FIG. 12 shows how the input voltage VIN, the output voltage VOUT, the gate voltage VPG (the gate signal G1) for driving the output transistor 1, and the gate voltage VPGF for driving the second output transistor 81 are changed over time.

According to FIG. 12, both the gate voltages VPG and VPGF start to rise at time t1 at which the input voltage VIN starts to rise from 4.75 V to 16 V. However, when focusing on a time at which the input voltage VIN has completely risen, a level of the gate voltage VPG rises to a certain value, whereas the gate voltage VPGF at that time is lower than the level of the gate voltage VPG and a delay in time may occur as compared to the rise in the gate voltage VPG. This is due to the CR circuit (the resistor 82 and the capacitor 83) included in the phase compensation circuit 8.

SUMMARY

According to an aspect of the present disclosure disclosed in the present specification, a linear power supply circuit includes: an output stage including a first output transistor and a second output transistor, which are provided between an input terminal to which an input voltage is able to be applied and an output terminal to which an output voltage is able to be applied and are connected in parallel to each other; a driver configured to drive the first output transistor and the second output transistor based on a difference between a voltage based on the output voltage and a reference voltage; a resistor inserted between a gate of the first output transistor and a gate of the second output transistor; a capacitor having one end connected to the input terminal and the other end connected to a connection node between the resistor and the gate of the second output transistor; and a clamp element connected in parallel to the resistor (a first configuration).

In the linear power supply circuit of the first configuration, the capacitor may be a parasitic capacitor of the second output transistor (a second configuration).

In the linear power supply circuit of the first or second configuration, when a first voltage applied to a control terminal of the first output transistor is higher than a second voltage applied to a control terminal of the second output transistor, the clamp element may clamp a difference between the first voltage and the second voltage (a third configuration).

In the linear power supply circuit of the third configuration, when the first voltage is smaller than the second voltage, the clamp element may not clamp the difference between the first voltage and the second voltage (a fourth configuration).

In the linear power supply circuit of any one of the first to fourth configurations, the clamp element may be an NMOSFET (N-channel type metal-oxide-semiconductor field effect transistor) having a gate and a drain short-circuited with each other (a fifth configuration).

In the linear power supply circuit of the fifth configuration, a back gate of the NMOSFET may be short-circuited with the drain of the NMOSFET (a sixth configuration).

In the linear power supply circuit of the fifth or sixth configuration, a parasitic capacitance formed between a source and the drain of the NMOSFET may be smaller than a capacitance value of the capacitor (a seventh configuration).

In the linear power supply circuit of any one of the first to seventh configurations, a capacitance value of the capacitor may be greater than a capacitance value of a capacitor, which is provided between a first terminal of the first output transistor connected to the input terminal and a control terminal of the first output transistor (an eighth configuration).

In the linear power supply circuit of any one of the first to eighth configurations, the capacitor may include a capacitance different from a parasitic capacitance formed between a first terminal of the second output transistor connected to the input terminal and a control terminal of the second output transistor (a ninth configuration).

In the linear power supply circuit of any one of the first to ninth configurations, the first output transistor and the second output transistor may have different sizes from each other (a tenth configuration).

In the linear power supply circuit of the tenth configuration, the size of the second output transistor may be larger than the size of the first output transistor (an eleventh configuration).

In the linear power supply circuit of any one of the first to eleventh configurations, the output stage may be composed of a PMOS (P-channel metal-oxide-semiconductor) common source circuit (a twelfth configuration).

A vehicle disclosed in the present specification includes the linear power supply circuit of any one of the first to twelfth configurations (a thirteenth configuration).

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the present specification, the term "constant voltage" means a voltage which is constant in an ideal state but may actually change slightly due to a temperature change or the like.

In the subject specification, the term "reference voltage" means a voltage which is constant in an ideal state but may actually change slightly due to a temperature change or the like.

In the subject specification, the term "constant current" means a current which is constant in an ideal state but may actually change slightly due to a temperature change or the like.

In the subject specification, the term "MOSFET" refers to a field effect transistor having a gate structure composed of at least three layers of a "layer formed of a conductor or a semiconductor such as polysilicon or the like having a small resistance value," an "insulating layer," and a "P-type, N-type, or intrinsic semiconductor layer." That is, the gate structure of the MOSFET is not limited to the three-layer structure of a metal, an oxide and a semiconductor.

First Embodiment

Figure 1:
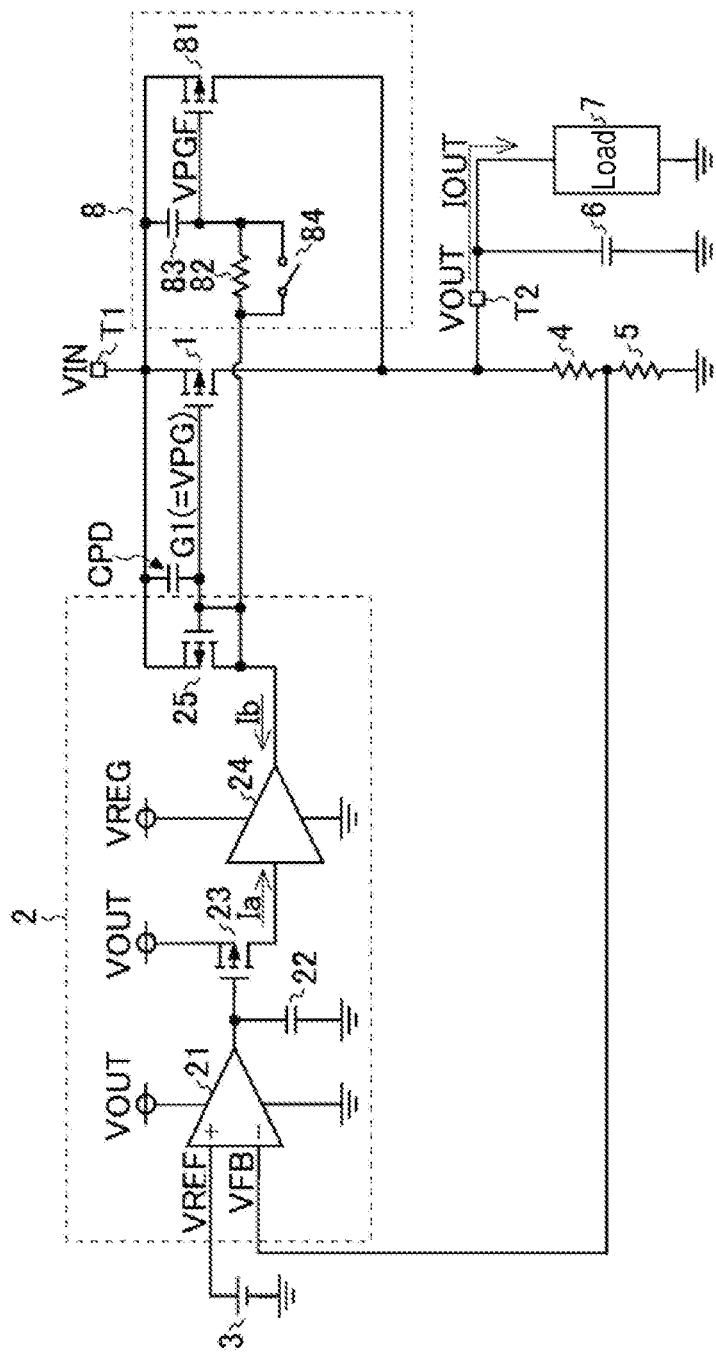
FIG. 1 is a diagram showing a configuration example of a linear power supply circuit according to a first embodiment.

FIG. 1 is a diagram showing a configuration example of a linear power supply circuit according to a first embodiment. The linear power supply circuit shown in FIG. 1 includes an input terminal T1, an output terminal T2, a first output transistor 1, a driver 2, a reference voltage generator 3, resistors 4 and 5, and a phase compensation circuit 8. An output capacitor 6 and a load 7 are externally attached.

The first output transistor 1 is provided between the input terminal T1 to which an input voltage VIN is applied and the output terminal T2 to which an output voltage VOUT is applied.

The driver 2 drives the first output transistor 1 and a second output transistor 81 described later. Specifically, the driver 2 drives the first output transistor 1 and the second output transistor 81 by supplying a gate signal G1 to a gate of the first output transistor 1 and a gate of the second output transistor 81 via a resistor 82 and a clamp element 84. Conductivity of the first output transistor 1 and the second output transistor 81 (i.e., an on-resistance value) is controlled by the gate signal G1. In the configuration shown in FIG. 1, PMOSFETs are used as the first output transistor 1 and the second output transistor 81. Therefore, as a voltage level of the gate signal G1 decreases, the conductivity of the first output transistor 1 and the second output transistor 81 increases, whereby the output voltage VOUT increases. On the other hand, as the voltage level of the gate signal G1 increases, the conductivity of the first output transistor 1 and the second output transistor decreases, whereby the output voltage VOUT decreases. As the first output transistor 1 and the second output transistor 81, NMOSFETs (N-channel type metal-oxide-semiconductor field effect transistors) or bipolar transistors may be used instead of the PMOSFETs.

The driver 2 includes a differential amplifier 21, a capacitor 22, a PMOSFET 23, a current amplifier 24, and a PMOSFET 25.

A feedback voltage VFB is applied to an inverting input terminal (−) of the differential amplifier 21, and a reference voltage VREF is applied to a non-inverting input terminal (+) of the differential amplifier 21. The driver 2 drives the first output transistor 1 and the second output transistor 81 based on a difference value ΔV (=VFB−VREF) between the feedback voltage VFB and the reference voltage VREF. The driver 2 raises the voltage level of the gate signal G1 as the difference value ΔV increases, and conversely lowers the voltage level of the gate signal G1 as the difference value ΔV decreases.

An output of the differential amplifier 21 is applied to one end of the capacitor 22, and the ground potential is applied to the other end of the capacitor 22.

The output voltage VOUT is applied to a source of the PMOSFET 23, and a voltage based on the output of the differential amplifier 21 (a voltage at a connection node between the differential amplifier 21 and the capacitor 22) is applied to a gate of the PMOSFET 23. The PMOSFET 23 converts the voltage based on the output of the differential amplifier 21 into a current and outputs the current from a drain thereof. Since the connection node between the differential amplifier 21 and the capacitor 22 is grounded in a high frequency band, it is possible to realize high-speed responsiveness of the driver 2.

Withstand voltages of the differential amplifier 21 and the PMOSFET 23 are lower than a withstand voltage of the current amplifier 24. Further, a gain of the differential amplifier 21 is smaller than a gain of the current amplifier 24. As a result, it is possible to downsize the differential amplifier 21 and the PMOSFET 23.

The current amplifier 24 amplifies a current Ia output from the drain of the PMOSFET 23. A power supply voltage of the current amplifier 24 is a constant voltage VREG. That is, the current amplifier 24 is driven by a voltage between the constant voltage VREG and the ground potential.

The PMOSFET 25 constitutes a current mirror circuit together with the first output transistor 1. The PMOSFET 25 converts a current Ib output from the current amplifier 24 into a voltage and supplies the voltage to the gate of the first output transistor 1.

The reference voltage generator 3 generates the reference voltage VREF. The resistors 4 and 5 generate the feedback voltage VFB, which is a divided voltage of the output voltage VOUT.

The output voltage VOUT supplied from the output terminal T2 is applied to the output capacitor 6 and the load 7.

The phase compensation circuit 8 includes the second output transistor 81, the resistor 82, the capacitor 83, and the clamp element 84.

The second output transistor 81 is connected in parallel to the first output transistor 1. That is, a source of the second output transistor 81 is connected to a source of the first output transistor 1, and a drain of the second output transistor 81 is connected to a drain of the first output transistor 1. In the present embodiment, a size of the second output transistor 81 is made larger than a size of the first output transistor 1 so that an amount of a current flowing through the second output transistor 81 becomes greater than an amount of a current flowing through the first output transistor 1. As used herein, the term "size" means an area.

One end of the resistor 82 is connected to each gate of the first output transistor 1 and the PMOSFET 25, and the other end of the resistor 82 is connected to the gate of the second output transistor 81.

The capacitor 83 is provided between the gate and the source of the second output transistor 81. In the present embodiment, a parasitic capacitor of the second output transistor 81 is used as the capacitor 83. However, a capacitor different from the parasitic capacitor of the second output transistor 81 may be used as the capacitor 83, and a capacitor different from the parasitic capacitor of the second output transistor 81 together with the parasitic capacitor of the second output transistor 81 may be used as the capacitor 83. By allowing the capacitor different from the parasitic capacitor of the second output transistor 81 to be included in the capacitor 83, it is possible to easily adjust a capacitance value of the capacitor 83. It is desirable that the capacitance value of the capacitor 83 is greater than a capacitance value of the parasitic capacitance CPD. The phase compensation circuit 8 may further include a capacitance provided between the gate and the drain of the second output transistor 81.

Figure 2A:
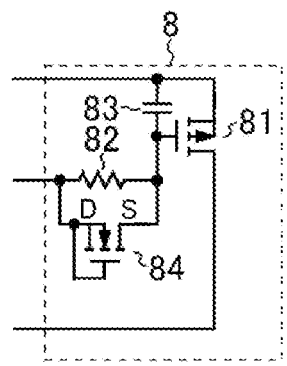
FIG. 2A is a diagram showing a configuration example of a phase compensation circuit.

The clamp element 84 is connected in parallel to the resistor 82. In the present embodiment, the clamp element 84 is a switch that is switched on and off based on fluctuation of the input voltage VIN. In one configuration example of the phase compensation circuit 8 shown in FIG. 2A, the switch is an NMOSFET, in which a gate and a drain are short-circuited with each other and a back gate is short-circuited with the drain. Alternatively, the clamp element 84 may be a diode. For example, a cathode of the diode is connected between one end of the resistor 82 and the capacitor 83, and an anode of the diode is connected to the other end of the resistor 82.

Figure 2B:
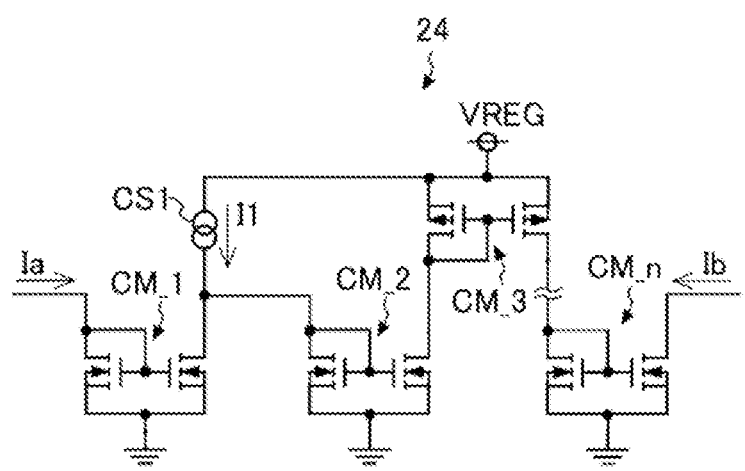
FIG. 2B is a diagram showing a configuration example of a current amplifier.

FIG. 2B is a diagram showing a configuration example of the current amplifier 24 of the linear power supply circuit shown in FIG. 1. The current amplifier 24 includes current sink type current mirror circuits CM_1, CM_2, . . . , and CM_n and current source type current mirror circuits CM_3, . . . , and CM_n−1 (where CM_n−1 is not shown in FIG. 2B). The current sink type current mirror circuits and the current source type current mirror circuits are alternately arranged from an input to an output of the current amplifier 24 between the current sink type current mirror circuit CM_1 and a constant current source CS1 that supplies a constant current I1, and the current sink type current minor circuit CM_n, whereby the current is amplified. The amplified current becomes the current Ib which is converted into the voltage of the gate signal G1 in the final stage.

Figure 3:
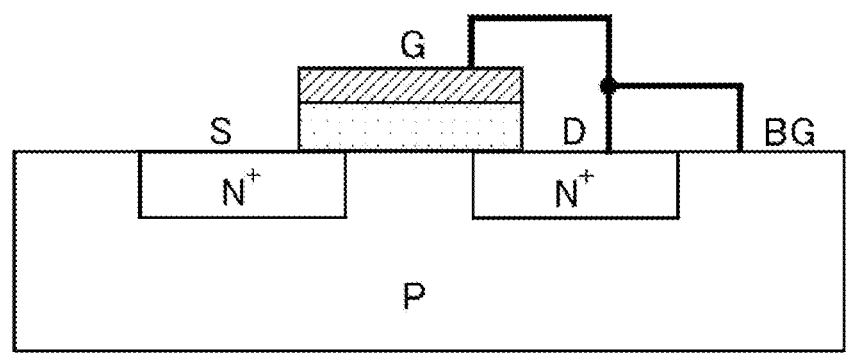
FIG. 3 is a diagram showing a cross-sectional structure of an NMOSFET, which is an example of a clamp element.

FIG. 3 is a diagram showing a cross-sectional structure of the NMOSFET, which is an example of the clamp element 84. A drain D and a control terminal gate G of an n-type semiconductor are short-circuited. That is, the NMOSFET shown in FIG. 3 is a diode-connected NMOSFET. As a result, the NMOSFET shown in FIG. 3 clamps a difference between a drain voltage of the NMOSFET and a source voltage of the NMOSFET (=the drain voltage of the NMOSFET−the source voltage of the NMOSFET) to a forward voltage Vf when the drain voltage of the NMOSFET is higher than the source voltage of the NMOSFET, more specifically, when the drain voltage of the NMOSFET is higher than the source voltage of the NMOSFET by the forward voltage Vf. On the other hand, the NMOSFET shown in FIG. 3 does not clamp the difference between the drain voltage of the NMOSFET and the source voltage of the NMOSFET (=the drain voltage of the NMOSFET−the source voltage of the NMOSFET) when the drain voltage of the NMOSFET is smaller than the source voltage of the NMOSFET. In the NMOSFET shown in FIG. 3, a parasitic capacitance formed between a source S and the drain D is set to a value smaller than that of the capacitor 83 in order to cause the clamping operation without delay.

Further, in the NMOSFET, a body diode having a direction from the source S to the drain D as a forward direction is usually formed between the source S and the drain D. However, since the drain D of an n-type semiconductor and a back gate BG of a p-type semiconductor are short-circuited, even when the source voltage of the NMOSFET becomes higher than the drain voltage of the NMOSFET, it is possible to prevent a current from flowing from the source S toward the drain D via the body diode.

Figure 4:
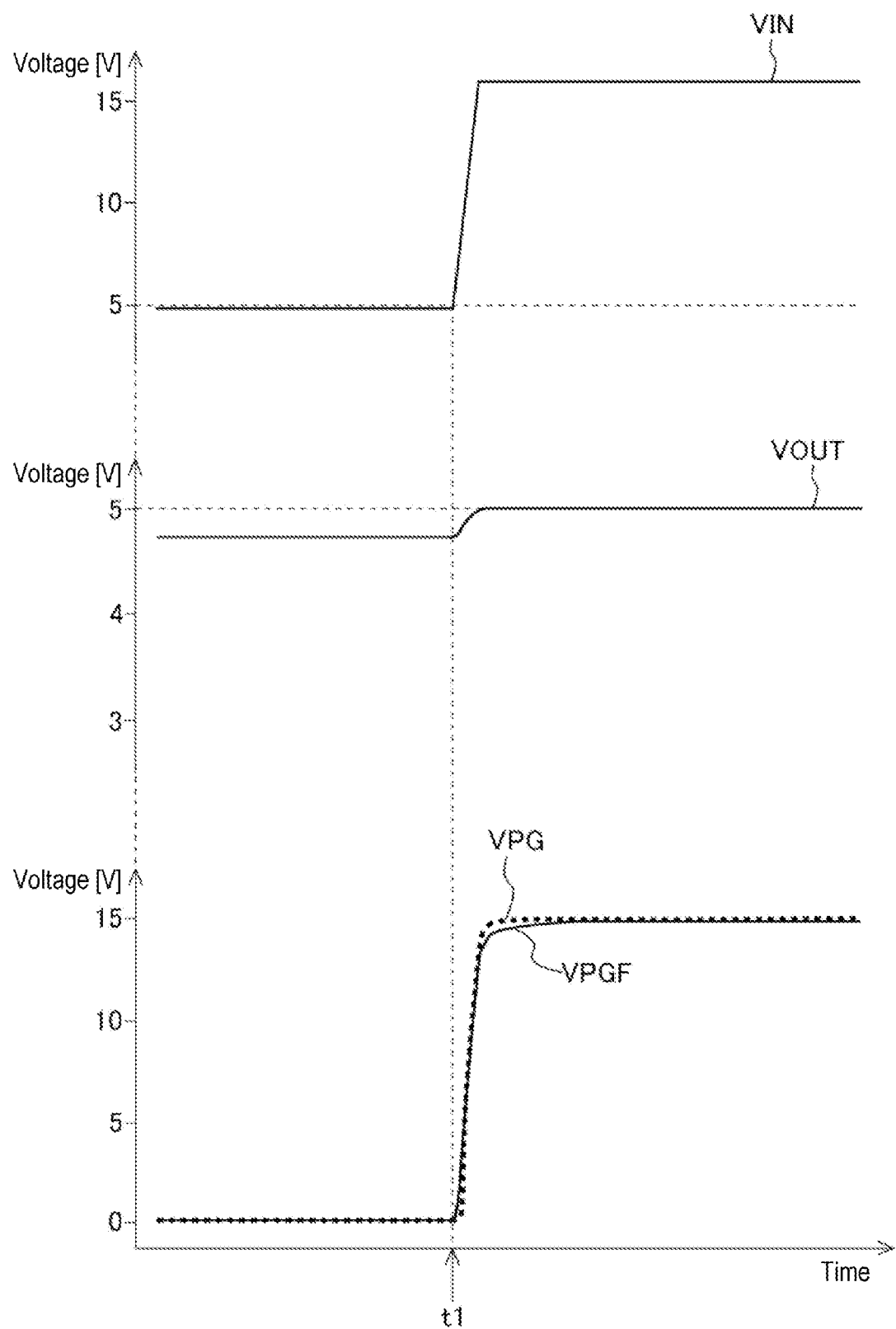
FIG. 4 is a diagram showing a relationship between a gate voltage and an output voltage of each of a first output transistor and a second output transistor in the linear power supply circuit shown in FIG. 1.

FIG. 4 is a diagram showing a relationship between the input voltage VIN, a gate voltage of each of the first output transistor 1 and the second output transistor 81, and the output voltage VOUT in the linear power supply circuit shown in FIG. 1. The vertical axis in FIG. 4 indicates voltage and the horizontal axis indicates time. That is, FIG. 4 shows how the input voltage VIN, the output voltage VOUT, the gate voltage (the gate signal G1) VPG for driving the first output transistor 1, and the gate voltage VPGF for driving the second output transistor 81 are changed over time.

According to FIG. 4, both the gate voltage VPG and the VPGF start to rise from time t1 at which the input voltage VIN starts to rise from 4.75 V to 16 V. The gate voltage VPGF rises without being delayed from the rise of the gate voltage VPG. The reason is that a voltage difference between the gate voltage VPG and the gate voltage VPGF is suppressed by clamping a voltage difference across the resistor 82 by the clamp element 84.

Focusing on the conductivity of each of the first output transistor 1 and the second output transistor 81, a difference in conductivity between the first output transistor 1 and the second output transistor 81 is suppressed because the voltage difference between the gate voltage VPG and the gate voltage VPGF is suppressed. Accordingly, the output voltage VOUT is suppressed from overshooting, and does not significantly exceed a target output voltage of 5 V.

Second Embodiment

Figure 5:
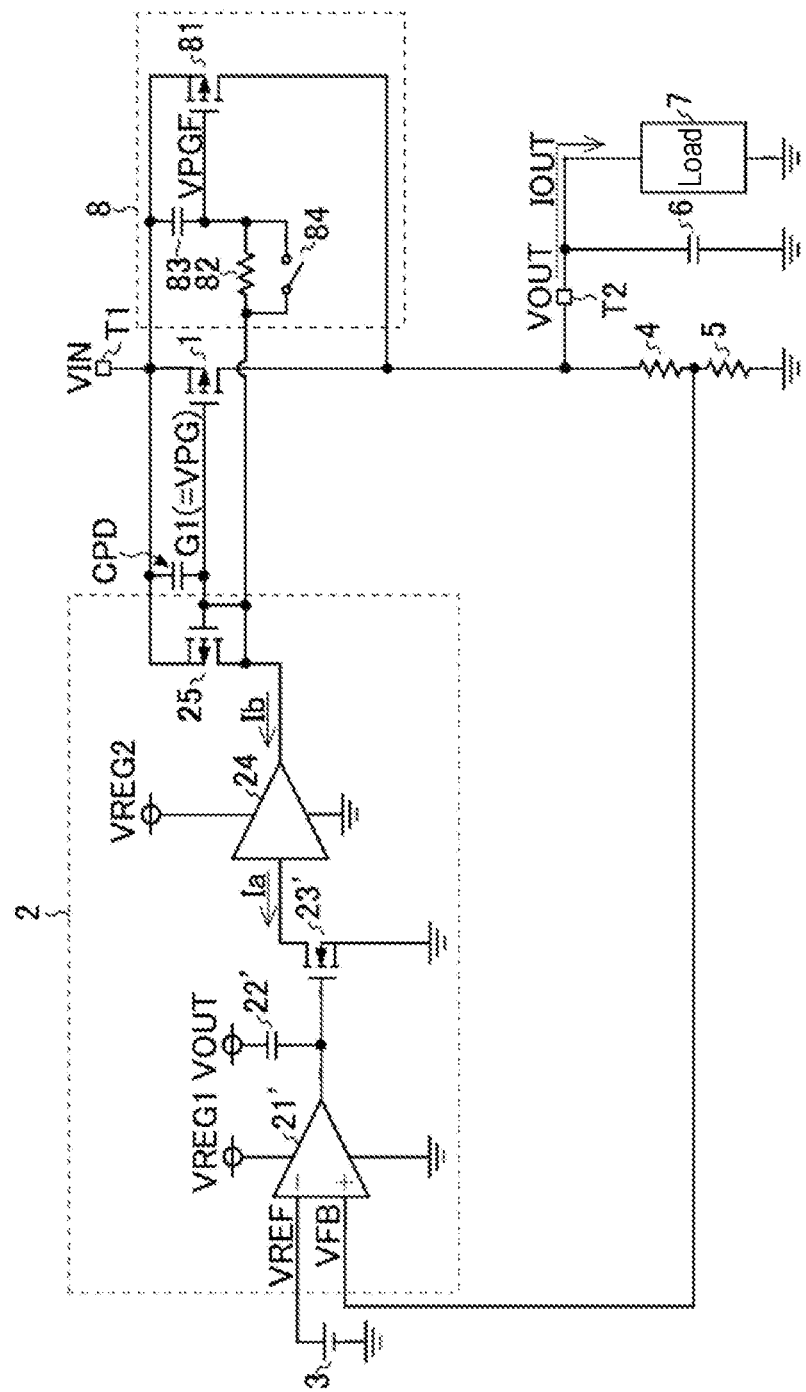
FIG. 5 is a diagram showing a configuration example of a linear power supply circuit according to a second embodiment.

FIG. 5 is a diagram showing a configuration of a linear power supply circuit according to a second embodiment. In FIG. 5, the same parts as those in FIG. 1 are designated by the like reference numerals, and the detailed description thereof will be omitted.

In the present embodiment, the driver 2 includes a differential amplifier 21', a capacitor 22', an NMOSFET 23', a current amplifier 24, and a PMOSFET 25.

The differential amplifier 21' outputs a voltage corresponding to a difference between the feedback voltage VFB and the reference voltage VREF. A power supply voltage of the differential amplifier 21' is a first constant voltage VREG1. That is, the differential amplifier 21' is driven by a voltage between the first constant voltage VREG1 and the ground potential.

A withstand voltage of the differential amplifier 21' and a withstand voltage of the NMOSFET 23' are lower than a withstand voltage of the current amplifier 24. Further, a gain of the differential amplifier 21' is smaller than a gain of the current amplifier 24. As a result, it is possible to downsize the differential amplifier 21' and the NMOSFET 23'.

An output of the differential amplifier 21' is applied to one end of the capacitor 22', and the output voltage VOUT is applied to the other end of the capacitor 22'. Instead of the output voltage VOUT, a voltage depending on the output voltage VOUT may be applied to the other end of the capacitor 22.

The ground potential is applied to a source of the NMOSFET 23', and a voltage based on the output of the differential amplifier 21' (a voltage at a connection node between the differential amplifier 21' and the capacitor 22') is applied to a gate of the NMOSFET 23'. The NMOSFET 23' converts the voltage based on the output of the differential amplifier 21' into a current and outputs the current from a drain thereof. Since the output voltage VOUT is applied to the connection node between the differential amplifier 21' and the capacitor 22' through the capacitor 22' in a high frequency band, it is possible to realize high-speed responsiveness of the driver 2.

Figure 6:
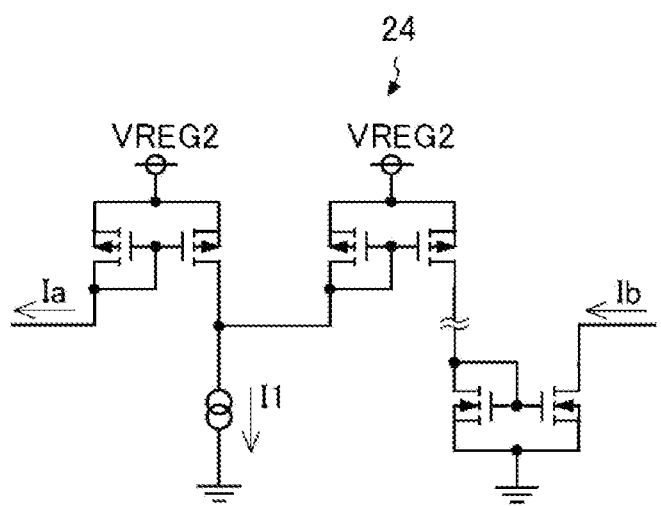
FIG. 6 is a diagram showing another configuration example of the current amplifier.

The current amplifier 24 amplifies a current Ia output from a drain of the NMOSFET 23'. A power supply voltage of the current amplifier 24 is a second constant voltage VREG2. That is, the current amplifier 24 is driven by a voltage between the second constant voltage VREG2 and the ground potential. The first constant voltage VREG1 and the second constant voltage VREG2 may have the same value or may have different values from each other. In this configuration example, the current Ia flows from the current amplifier 24 toward the NMOSFET 23'. Therefore, the current amplifier 24 may have a circuit configuration shown, for example, in FIG. 6.

The phase compensation circuit of the linear power supply circuit according to the present embodiment shown in FIG. 5 is the same as that of the linear power supply circuit according to the first embodiment shown in FIG. 1. Therefore, the output voltage VOUT can be suppressed from overshooting by the same effect. Further, the linear power supply circuit according to the present embodiment shown in FIG. 5 can ensure the operation of the differential amplifier 21' even when a set value of the output voltage VOUT is low. When a low voltage is used as the input voltage VIN, the input voltage VIN may be used as the power supply voltage of the differential amplifier 21' instead of the first constant voltage VREG1, and the input voltage VIN may be used as the power supply voltage of the current amplifier 24 instead of the second constant voltage VREG2.

Third Embodiment

Figure 7:
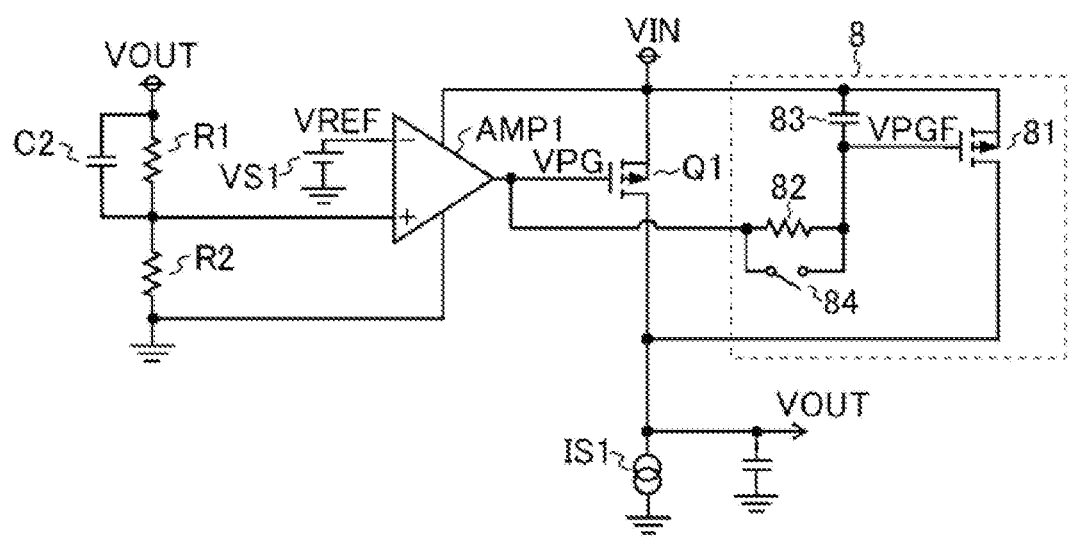
FIG. 7 is a diagram showing a configuration example of a linear power supply circuit according to a third embodiment.

FIG. 7 is a diagram showing a configuration of a linear power supply circuit according to a third embodiment. In the linear power supply circuit shown in FIG. 7, the phase compensation circuit 8 is applied to a linear power supply circuit including a generally well-known output stage composed of a PMOS common source circuit.

Since the linear power supply circuit including the output stage connected the PMOS source shown in FIG. 7 is well known in the related art, detailed description thereof will be omitted. Also in the linear power supply circuit shown in FIG. 7, the output voltage can be suppressed from overshooting by reducing a difference in conductivity between an output transistor Q1 and the second output transistor 81.

As described above, the phase compensation circuit according to the present disclosure disclosed in the present specification is not limited to the linear power supply circuits according to the first embodiment and the second embodiment, and can be applied to a case where there is a plurality of output transistors.

Application Example 1

Figure 8:
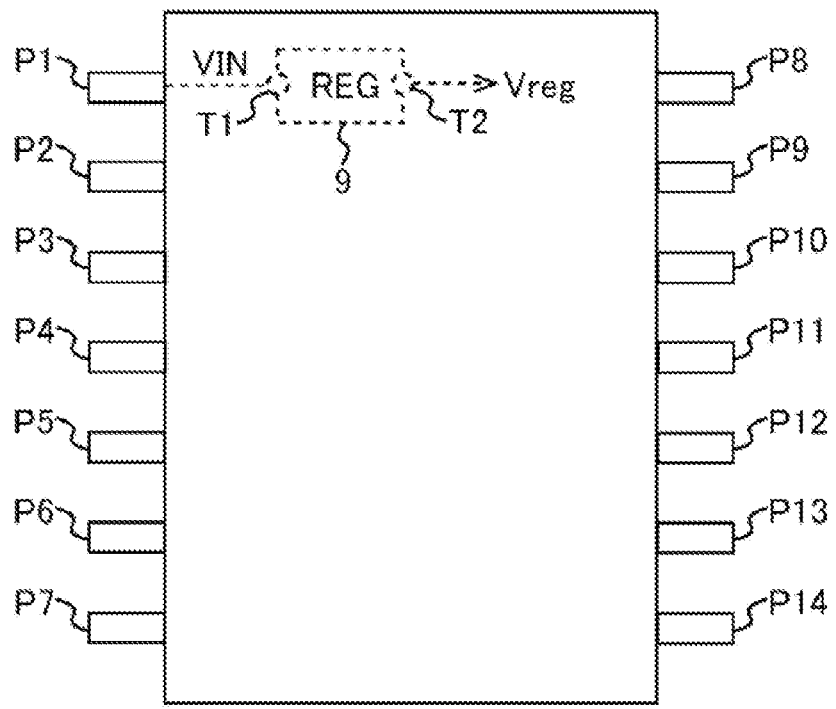
FIG. 8 is an external view of a semiconductor integrated circuit device.

FIG. 8 is an external view of a semiconductor integrated circuit device. The semiconductor integrated circuit device shown in FIG. 8 includes external pins P1 to P14, and has an internal power supply 9 provided therein. The internal power supply 9 is a linear power supply circuit according to any one of the first to third embodiments described above. When provided internally, it does not matter whether or not there is an output capacitor. The internal power supply 9 supplies an internal power supply voltage Vreg (=the output voltage VOUT of the linear power supply circuit) to at least a part of circuits in the semiconductor integrated circuit device shown in FIG. 8.

Application Example 2

Figure 9:
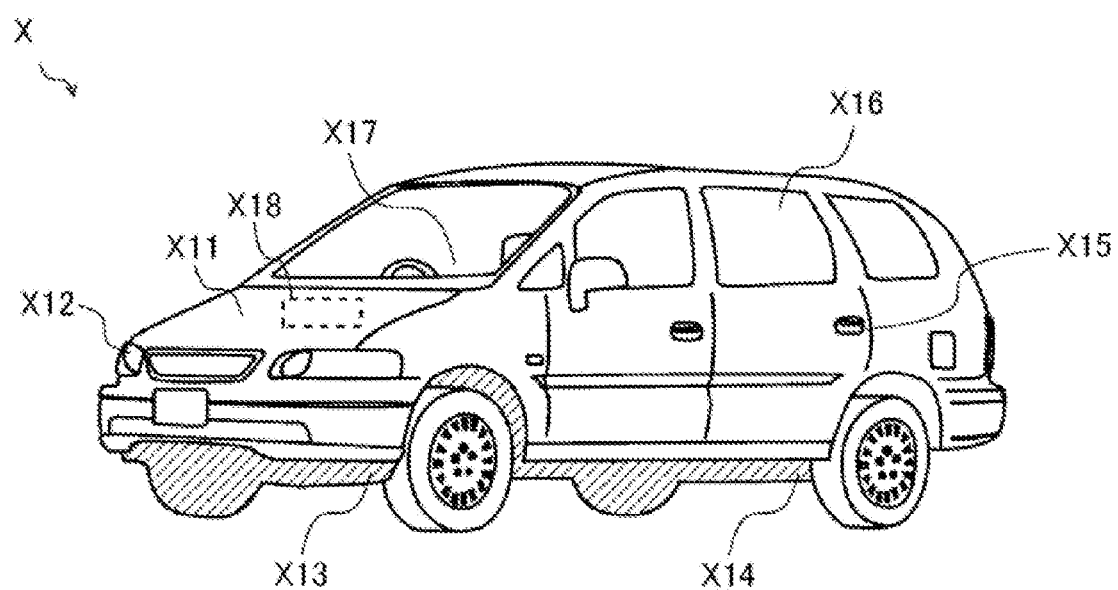
FIG. 9 is an external view of a vehicle.
Figure 10:
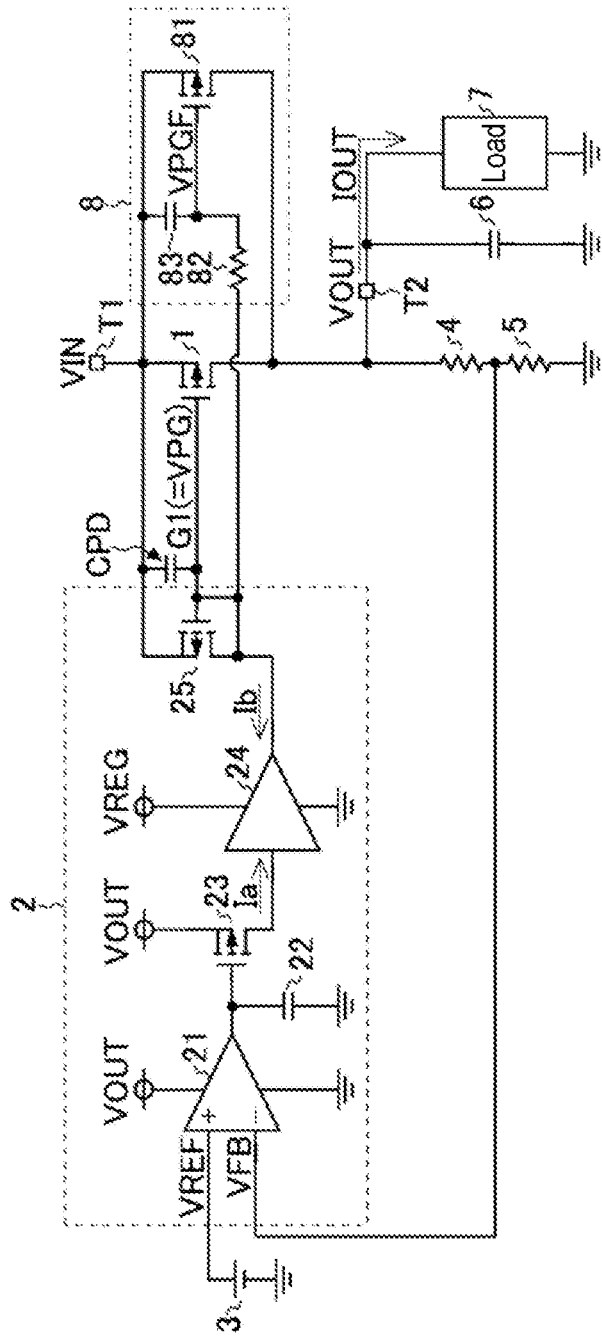
FIG. 10 is a diagram showing a configuration example of a linear power supply circuit in the related art.
Figure 11:
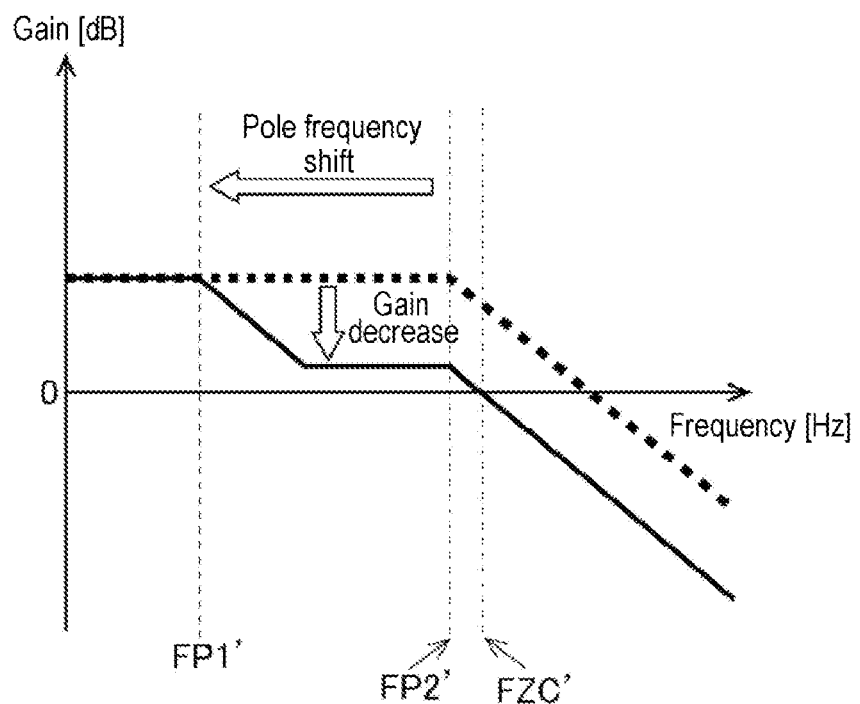
FIG. 11 is a diagram showing gain characteristics of a transfer function of an output capacitor of the linear power supply circuit shown in FIG. 10.
Figure 12:
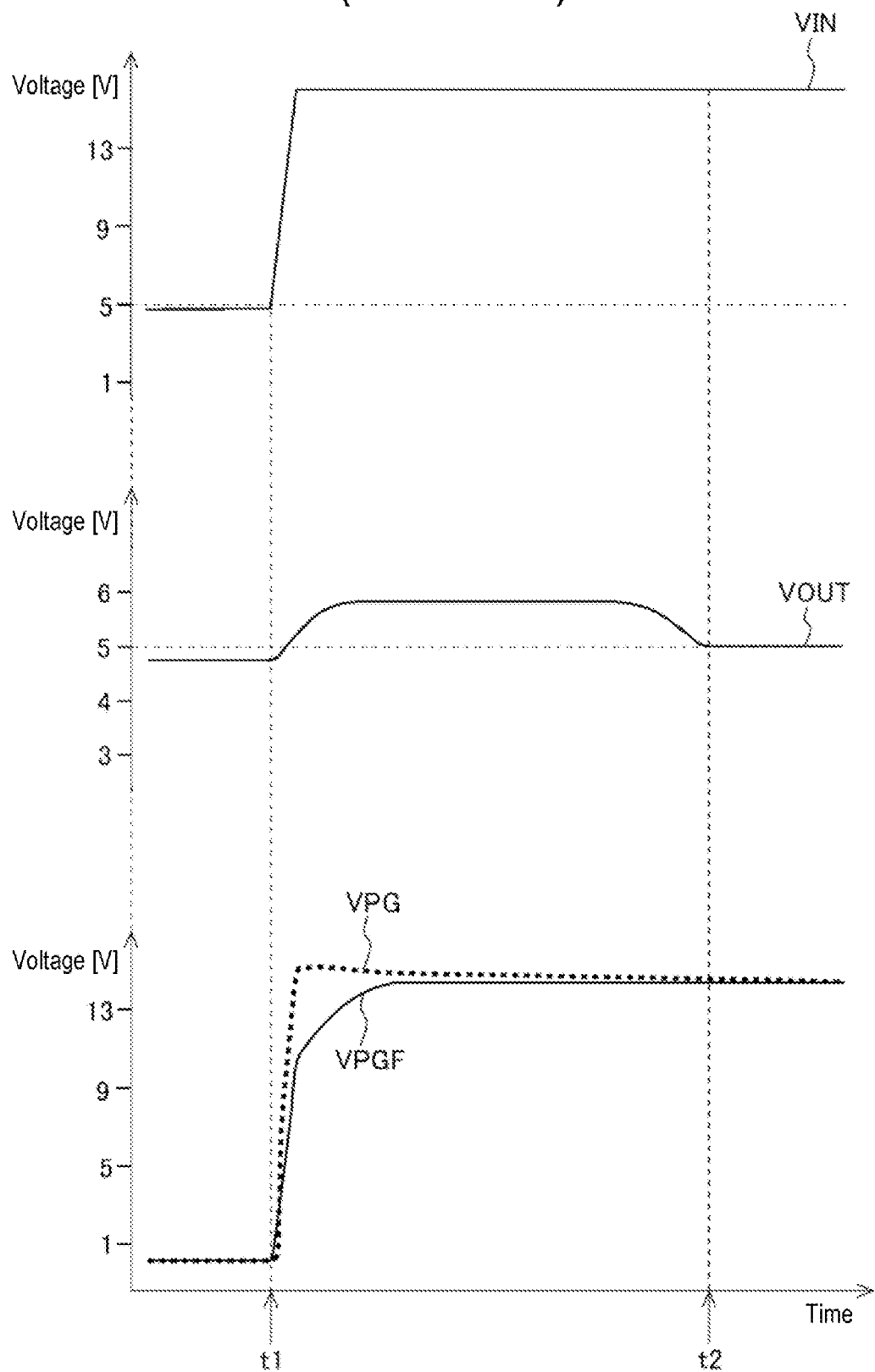
FIG. 12 is a diagram showing a relationship between a gate voltage and an output voltage of each of a first output transistor and a second output transistor in the linear power supply circuit shown in FIG. 10.

FIG. 9 is an external view of a vehicle X. The vehicle X of this configuration example is equipped with various electronic devices X11 to X18, which are operated by being supplied with a voltage output from a battery (not shown). Mounting positions of the electronic devices X11 to X18 in FIG. 9 may differ from actual mounting positions for the sake of convenience of illustration.

The electronic device X11 is an engine control unit that performs control related to an engine (injection control, electronic throttle control, idling control, oxygen sensor heater control, auto cruise control, and the like).

The electronic device X12 is a lamp control unit that performs on/off control of an HID (High Intensity Discharged) lamp or a DRL (Daytime Running Lamp).

The electronic device X13 is a transmission control unit that performs control related to a transmission.

The electronic device X14 is a braking unit that performs control related to a movement of the vehicle X (ABS (Anti-lock Brake System) control, EPS (Electric Power Steering) control, electronic suspension control, and the like).

The electronic device X15 is a security control unit that performs drive control of a door lock or a security alarm.

The electronic device X16 is an electronic device incorporated in the vehicle X at a factory shipment stage as a standard device or a manufacturer's option such as a wiper, an electric door mirror, a power window, a damper (shock absorber), an electric sunroof, an electric seat, or the like.

The electronic device X17 is an electronic device that is optionally mounted on the vehicle X as a user option such as an in-vehicle A/V (Audio/Visual) device, a car navigation system, an ETC (Electronic Toll Collection) system, or the like.

The electronic device X18 is an electronic device provided with a high-withstand-voltage motor, such as an in-vehicle blower, an oil pump, a water pump, a battery cooling fan, or the like.

The linear power supply circuit described above can be incorporated into any of the electronic devices X11 to X18.

OTHERS

It should be noted that the above-described embodiments are exemplary in all respects and are not limitative. The technical scope of the present disclosure disclosed herein is not indicated by the description of the embodiments, but is indicated by the claims. It should be understood that the technical scope of the present disclosure includes all modifications that fall within the meaning and scope of the claims.

The phase compensation circuit may be any circuit that can suppress a delay between drive signals of transistors connected in parallel, and is not limited to the specific circuit configurations of the phase compensation circuit 8 which is merely an example.

According to the present disclosure in some embodiments, it is possible to suppress overshooting of an output voltage due to a delay caused by a resistor and a capacitor for phase compensation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A linear power supply circuit, comprising:
   an output stage including a first output transistor and a second output transistor, which are provided between an input terminal to which an input voltage is able to be applied and an output terminal to which an output voltage is able to be applied and are connected in parallel to each other;
   a driver configured to drive the first output transistor and the second output transistor based on a difference between a voltage based on the output voltage and a reference voltage;
   a resistor inserted between a gate of the first output transistor and a gate of the second output transistor;
   a capacitor having one end connected to the input terminal and the other end connected to a connection node between the resistor and the gate of the second output transistor; and
   a clamp element connected in parallel to the resistor,
   wherein when a first voltage applied to a control terminal of the first output transistor is higher than a second voltage applied to a control terminal of the second output transistor, the clamp element clamps a difference between the first voltage and the second voltage.

2. The linear power supply circuit of claim 1, wherein the capacitor is a parasitic capacitor of the second output transistor.

3. The linear power supply circuit of claim 1, wherein when the first voltage is smaller than the second voltage, the clamp element does not clamp the difference between the first voltage and the second voltage.

4. The linear power supply circuit of claim 1, wherein the clamp element is an NMOSFET (N-channel type metal-oxide-semiconductor field effect transistor) having a gate and a drain short-circuited with each other.

5. The linear power supply circuit of claim 4, wherein a back gate of the NMOSFET is short-circuited with the drain of the NMOSFET.

6. The linear power supply circuit of claim 4, wherein a parasitic capacitance formed between a source and the drain of the NMOSFET is smaller than a capacitance value of the capacitor.

7. The linear power supply circuit of claim 1, wherein a capacitance value of the capacitor is greater than a capacitance value of a capacitor, which is provided between a first terminal of the first output transistor connected to the input terminal and a control terminal of the first output transistor.

8. The linear power supply circuit of claim 1, wherein the capacitor includes a capacitance different from a parasitic capacitance formed between a first terminal of the second output transistor connected to the input terminal and a control terminal of the second output transistor.

9. The linear power supply circuit of claim 1, wherein the first output transistor and the second output transistor have different sizes from each other.

10. The linear power supply circuit of claim 9, wherein the size of the second output transistor is larger than the size of the first output transistor.

11. The linear power supply circuit of claim 1, wherein the output stage is composed of a PMOS common source circuit.

12. A vehicle comprising the linear power supply circuit of claim 1.

13. A linear power supply circuit, comprising:
   an output stage including a first output transistor and a second output transistor, which are provided between an input terminal to which an input voltage is able to be applied and an output terminal to which an output voltage is able to be applied and are connected in parallel to each other;
   a driver configured to drive the first output transistor and the second output transistor based on a difference between a voltage based on the output voltage and a reference voltage;
   a resistor inserted between a gate of the first output transistor and a gate of the second output transistor;
   a capacitor having one end connected to the input terminal and the other end connected to a connection node between the resistor and the gate of the second output transistor; and
   a clamp element connected in parallel to the resistor,
   wherein the clamp element is an NMOSFET (N-channel type metal-oxide-semiconductor field effect transistor) having a gate and a drain short-circuited with each other, and
   wherein a back gate of the NMOSFET is short-circuited with the drain of the NMOSFET.

14. A linear power supply circuit, comprising:
   an output stage including a first output transistor and a second output transistor, which are provided between an input terminal to which an input voltage is able to be applied and an output terminal to which an output voltage is able to be applied and are connected in parallel to each other;
   a driver configured to drive the first output transistor and the second output transistor based on a difference between a voltage based on the output voltage and a reference voltage;
   a resistor inserted between a gate of the first output transistor and a gate of the second output transistor;
   a capacitor having one end connected to the input terminal and the other end connected to a connection node between the resistor and the gate of the second output transistor; and
   a clamp element connected in parallel to the resistor,
   wherein the clamp element is an NMOSFET (N-channel type metal-oxide-semiconductor field effect transistor) having a gate and a drain short-circuited with each other, and
   wherein a parasitic capacitance formed between a source and the drain of the NMOSFET is smaller than a capacitance value of the capacitor.

* * * * *